United States Patent [19]

Wegleiter et al.

[11] Patent Number: 5,972,781

[45] Date of Patent: Oct. 26, 1999

[54] METHOD FOR PRODUCING SEMICONDUCTOR CHIPS

[75] Inventors: Walter Wegleiter, Nittendorf; Olaf Schoenfeld, Regensburg, both of Germany; Muk Wai Lui, Milpitas, Calif.; Ernst Nirschl, Wenzenbach, Germany

[73] Assignees: Siemens Aktiengesellschaft, Munich, Germany; Siemens Microelectronics, Inc., Cupertino, Calif.

[21] Appl. No.: 08/940,465

[22] Filed: Sep. 30, 1997

[51] Int. Cl.⁶ .................................................. H01L 21/301
[52] U.S. Cl. ............................................ 438/460; 438/464
[58] Field of Search .................................... 438/460, 462, 438/463, 464, 950, 951

[56] References Cited

U.S. PATENT DOCUMENTS

| | | | |
|---|---|---|---|
| 3,963,489 | 6/1976 | Cho | 96/27 R |
| 4,047,184 | 9/1977 | Bassous et al. | 346/75 |
| 4,071,944 | 2/1978 | Chuss et al. | 29/574 |
| 4,679,299 | 7/1987 | Szluk et al. | 29/557 |
| 4,710,263 | 12/1987 | Kato | 156/637 |
| 4,818,712 | 4/1989 | Tully | 437/26 |
| 4,822,755 | 4/1989 | Hawkins et al. | 437/227 |
| 5,075,256 | 12/1991 | Sliwa, Jr. | 437/209 |
| 5,429,954 | 7/1995 | Gerner | 437/23 |
| 5,597,766 | 1/1997 | Neppl | 437/226 |
| 5,622,900 | 4/1997 | Smith | 438/464 |
| 5,637,189 | 6/1997 | Peeters et al. | 438/466 |
| 5,770,884 | 6/1998 | Pogge et al. | 257/506 |
| 5,789,307 | 8/1998 | Igel et al. | 438/464 |

*Primary Examiner*—Bruce Breneman
*Assistant Examiner*—Allan Olsen
*Attorney, Agent, or Firm*—Herbert L. Lerner; Laurence A. Greenberg

[57] ABSTRACT

Semiconductor chips are produced from a wafer. The semiconductor chips are separated from one another by etching the wafer all the way through, by a dry etching process, in defined separation zones between the semiconductor chips. Initially, first etching trenches for separating the p-n junctions are etched into the wafer. Then, second etching trenches are etched from the opposite side of the wafer until the individual semiconductor chips are completely separated.

37 Claims, 3 Drawing Sheets

METHOD FOR PRODUCING SEMICONDUCTOR CHIPS

BACKGROUND OF THE INVENTION

Field of the Invention

The invention relates to a method for producing semiconductor chips from a wafer. The invention is particularly directed to the method step of separating the individual semiconductor chips from one another and to separate them out of the wafer.

It has thus far been conventional to separate semiconductor chips from one another and the wafer by sawing the chips out of the wafer, or by scoring the wafer surface and breaking the chips out of the wafer. Despite efforts toward improving sawblades and the sawing apparatus, the sawblades used in the sawing as a rule have a thickness of more than 30 $\mu$m. The attendant loss of semiconductor material is correspondingly high, and the spacing between the individual semiconductor chips must be relatively great. This in turn means that only relatively few semiconductor chips can be accommodated on one wafer.

Moreover, in the sawing of the semiconductor chips, damage in the form of microscopic cracks or flaking occurs, which must be minimized in a separate etching step, so-called damage etching.

Similar disadvantages arise in scoring and breaking semiconductor chips as well. For instance, in sawing semiconductor chips with an edge length of 200 $\mu$m, material losses of approximately 36% are observed. This proportion rises with decreasing chip size, and for chips with an edge length of 150 $\mu$m it amounts to approximately 44%. The conventional methods are accordingly unsatisfactory from a commercial, economic standpoint.

SUMMARY OF THE INVENTION

It is accordingly an object of the invention to provide a method of producing semiconductor chips, which overcomes the above-mentioned disadvantages of the prior art methods of this general type and which enables semiconductor chip production in a simple, economical way, and in which the loss of semiconductor material can be kept as small as possible.

With the foregoing and other objects in view there is provided, in accordance with the invention, a method for producing semiconductor chips from a wafer, which comprises:

defining separation zones for individual semiconductor chips on a wafer; and dry etching trenches into the wafer at the separation zones and entirely through the wafer for severing the wafer completely into individual semiconductor chips.

In accordance with an added feature of the invention, the dry etching step includes a first etching step in which p-n junctions of the semiconductor chips are separated by etching first etching trenches. A second etching step following the first etching step comprising etching trenches completely through the wafer and severing the individual semiconductor chips from one another.

In accordance with an additional feature of the invention, the semiconductor chips are tested in the wafer after the p-n junctions are separated in the first etching step.

The method of the invention is particularly suitable for producing semiconductor chips having an edge length of at least 100 $\mu$m, and in particular for producing LEDs.

The method of the invention is distinguished in that the semiconductor chips are separated from one another by etching the wafer all the way through, using a dry etching process, in the region of the separation zones between the semiconductor chips. The dry etching processes that can be employed in the method of the invention fundamentally correspond to those etching methods that have been used previously for structuring individual layers of a semiconductor substrate, for instance for creating so-called mesa structures. For example, dry etching processes have previously been used to sever the p-n junction of semiconductor layers, by etching so-called mesa trenches in the junction region. In that case, the etching depth is in a range between 10 and 20 $\mu$m. The etching process pertains only to individual layers of the semiconductor substrate, while other layers are not exposed to the etching process, so that the processed chips still remain part of the wafer package. The chips are then conventionally separated out by one of the methods described above.

According to the invention, the dry etching processes are now employed in order to etch the wafer all the way through its entire thickness, so that in the separation zone between the individual chips, etching trenches are created that extend through the entire wafer. With the dry etching processes, very good aspect ratios can be achieved, so that vertically oriented isotropic trenches with etching widths of less than 20 $\mu$m can be created. The spacing between individual semiconductor chips on the wafer can correspondingly be very slight. This means, on the one hand, that the number of semiconductor chips on the wafer can be increased and, on the other that, that the loss of semiconductor material is minimal. In this way, up to about 30% savings in semiconductor material and about 20% savings for the cost of a conventional sawing-type separation process can be achieved. Moreover, the additional step of damage etching becomes unnecessary.

A further advantage of separating the semiconductor chips with the aid of a dry etching process resides in the very short etching duration and in the fact that separation of all the semiconductor chips on one wafer can be done simultaneously in a single processing step. This makes for very fast, inexpensive separation of the semiconductor chips, and moreover employs the work equipment and work steps that are already fundamentally known from the prior art.

As already mentioned, in principle all the dry etching processes in the prior art that have previously been used for etching the various semiconductor materials can be employed. The etchants used depend on the semiconductor material to be etched in a given case. For example, until now, etching gallium arsenide, gallium phosphide or gallium nitride as well as aluminum-containing or indium-containing semiconductor materials (e.g. InAlAs or InGaN), has been effected with such highly reactive gases as chlorine, silicon tetrachloride or boron trichloride in a suitable reactor for so-called reactive ion etching (RIE). These etchants can also be employed in the method of the invention, but the method is not limited to these etchants. Other fundamentally suitable etchants for semiconductor materials, which include elements from the third to fifth main groups of the periodic table, are described for instance by D. Widmann in: "Technologie hochintegrierter Schaltungen" [The Technology of Large-Scale Integrated Circuits], Second Edition, Springer, Berlin 1996, in Chapter 5.2, "Trockenätzen" [Dry Etching], and in K. Schade, "Mikroelektronik-Technologie" [Microelectronics], First Edition, Verlag Technik, Berlin 1991, Chapter 7, "Ätzen und Reinigen" [Etching and Cleaning]. Etchants that are preferred according to the invention are those that comprise a mixture of a Lewis acid with chlorine. As the Lewis acid, boron trichloride or boron tribromide can for instance be used. If the semiconductor substrate to be etched does not contain aluminum, then boron trifluoride can likewise be used as the Lewis acid.

A preferred etchant is, in particular boron trifluoride, and chlorine in a molar ratio from 1:9 to 9:1 . A ratio of 1:1 is especially preferred.

The method of the invention can in principle be performed in any way known for dry etching, in conventional reactors. Those methods in which etching can be done highly anisotropically are preferred, that is, methods in which the etching rate in the vertical direction is very much greater than in the horizontal direction. The etched trenches for separating the semiconductor chips are very narrow in that case, for instance smaller than 20 $\mu$m, and the loss of semiconductor material from the dry etching is correspondingly slight. As a consequence, many semiconductor chips can be accommodated on one wafer.

In accordance with another feature of the invention, the dry etching is effected by reactive ion etching (RIE), ECR (electron cyclotron resonance) etching, or etching with an inductively coupled plasma source (ICP).

Examples of suitable reactors are a parallel plate reactor, in which a plasma is ignited at low pressures, between 5 and 75 mTorr with a radial frequency typically of 13.56 or 27.12 MHz, with the coupling being effected capacitively (CCP plasma). Cylindrical reactors are also suitable, in which the radial frequency is coupled inductively (ICP plasma) at a pressure of less than 1 mTorr. The specimen is located downstream on an electrode, to which radio frequency can additionally be coupled capacitively. Alternatively in a cylindrical reactor, a microwave field with reinforcement from a static magnetic field can be used to generate the plasma. In this case as well, the specimen is located downstream on an electrode to which radio frequency can be additionally capacitively coupled once again (ECR excitation). The microwave power is preferably between 400 and 1000 W.

A reactor with ion beam equipment (IBE) can also be used. In such a reactor, typically with direct current or with an inductively coupled radio frequency, a typically inert plasma is generated from noble gas or nitrogen. The plasma is extracted from the reactor through a so-called optical grating and is aimed at the specimen to be structured. To that end, a gas shower, through which the reactive gas is delivered to the specimen, is typically located above the specimen (CAIBE).

When the dry etching process is performed in these reactors, the etching operations can be carried out highly anisotropically. In the case of parallel plate reactor, the plasma density is less by approximately 1.5 orders of magnitude than in the other processes mentioned. In order to attain a comparable etching rate, substantially higher electrode voltages must accordingly be applied. Nevertheless, this process for etching silicon semiconductor materials has proven itself quite well.

Satisfactory etching rates can be attained above all if, as is preferred according to the invention, a combination of a Lewis acid with chloride is used as the etchant. Because of the presence of the Lewis acid, the concentration of chlorine cations ($Cl^+$ and $Cl_2^+$) increases, and as a result the etching rate rises sharply. For a two-inch wafer, nearly the entire surface of which (95 to 98%) is exposed to the etching gas, etching rates of up to 4 $\mu$m per minute can be attained by the CCP-RIE method, and of up to one micrometer per minute by the ECR-RIE method. By using an ICP reactor, these etching rates can be increased still further. Using the CAIBE method is recommended above all if the etching angle is to be freely adjusted. If one compares the etching rates that are attained with a combination of Lewis acid and chlorine with the etching rate of 50–100 nm per minute that is typically attained with $BCl_3$/Ar, then increasing the etching rate by a factor of about 40 is possible, without producing any optical degradation of the surface.

In accordance with a further feature of the invention, the etching of trenches between the p-n junctions of semiconductor chips, which is known per se and described at the outset above, is combined with etching all the way through the wafer in order to separate the chips. In a first etching step, the p-n junctions are separated by etching first etching trenches. The RIE etching processes described above can for instance be used for this. After the etching of the p-n junctions, the semiconductor chips, still in the wafer package, can be tested for operability in a conventional manner. Not until after the separation of the p-n junctions and optionally after the conclusion of the tests are the individual semiconductor chips then separated from one another by etching the second etching trenches. The through-etching is then preferably effected from the back side of the wafer, that is, the side remote from the p-n junctions.

To achieve a complete severing of the wafer, the etching duration is typically longer than in the prior art etching processes in which only individual layers of a semiconductor substrate are etched. The longer duration of the dry etching operation in etching through the wafer typically leads to an elevation of the temperature in the etching chamber, so that the temperature in the method of the invention is also higher than in conventional dry etching processes. By way of example, suitable parameters are found in an etching duration of 15 minutes to three hours, and at a temperature above 150° C., and in particular above 200° C.

To prevent the separated semiconductor chips etched out of the wafer from losing their position defined by the wafer package, the semiconductor chips in the method of the invention are preferably releasably fixed in their predetermined positions. This may for instance involve a magnetic or ferromagnetic fixation. Expediently, the wafer to be etched is placed on a magnetic or ferromagnetic substrate, and delivered on it to the etching apparatus.

Particularly when smaller semiconductor chips are produced, with an edge length of less than 150 $\mu$m and for example as short as 100 $\mu$m, the releasable fixation of the semiconductor chips is preferably effected using a plastic film. For the releasable fixation of the semiconductor chips, this plastic film is expediently provided on one of its surfaces with an adhesive layer, to which the semiconductor chips continue to adhere. To simplify handling, the film is expediently fastened on or in a frame. In accordance with a preferred variant, the film is fastened in an annular silicon frame.

The adhesive film not only prevents the individual semiconductor chips, obtained after the through-etching, from slipping during the dry etching operation and losing their predetermined position, which would make it extremely difficult or even impossible to further process the chips, but the film can also be used as a substrate material in the further processing steps of the semiconductor chips. Accordingly, it is unnecessary to sift the semiconductor chips onto some other substrate after the dry etching process of the invention.

To keep the thermal stress on the wafer and film during the dry etching process of the invention slight, a heat sink may be disposed on a side of the film opposite from the wafer. Preferably, a metal plate, and in particular an aluminum plate, is used for this purpose. If a frame is used for fastening the film, then the metal plate expediently has a thickness and an outer diameter that are substantially equivalent to the height of the frame down to the underside of the film, and to the inside diameter of the frame.

All the materials that are disposed in the etching chamber in the dry etching process are preferably selected such that they outgas as little as possible under the conditions of the dry etching process, so as not to change the composition of the etchant. In the case of the plastic film, accordingly, a plastic film of the type that is resistant under the conditions of the dry etching process, for instance at the elevated temperature. Furthermore, the plastic film should be chemically inert.

The method according to the invention has the further advantage that metal layers, which are present on one or both surfaces of the wafer (e.g. metal contacts or full-surface metal coatings), can likewise be severed by the method of the invention. Metal layers which are located on the wafer surfaces at the boundary edges of the semiconductor chips to be severed, can accordingly be severed in the same dry etching apparatus, in the same work step as the semiconductor substrate. As a result, the same etchant as for severing the semiconductor substrate is used. However, it is also possible to vary the composition of the etchant over the course of the dry etching process and adapt it purposefully to the particular materials, metal or semiconductor substrate, to be etched.

In accordance with again a further feature of the invention, the metal contacts or full-surface metal coating which can be etched in the same work step as the semiconductor substrate, are formed of gold or of gold alloy (e.g. gold-zinc or gold-germanium).

Prior to the second dry etching step which etches through the wafer, a mask is applied to the surface of the wafer that is to be exposed to the etchant. This is a conventional masking process. The mask leaves the separation zone between the semiconductor chips, where the etching trenches are to be created, free. Suitable masks are known masks of photoresist or so-called hard masks. The latter are formed, for instance, of silicon dioxide or silicon nitride. The mask is applied and stuctured in a conventional manner.

The method of the invention is preferably performed such that a selectivity (ratio of the etching rate of the semiconductor substrate to that of the mask) of at least 10 and an aspect ratio 20 are obtained. At an etching depth of 100 nm, for instance, the lateral shrinkage of the mask should accordingly not be greater than 5 $\mu$m, and the mask thickness should be no greater than 10 $\mu$m. Especially in the case of photoresist masks, because of the high etching temperatures and the long duration of the dry etching process according to the invention, the problem arises that the photoresist changes its structure and following the etching process can be detached only with great difficulty. When a plastic film is used as the substrate for the wafer or the already separated semiconductor chips, then incineration cannot be employed as a method for removing the photoresist mask, since the plastic film would also be attacked by the incineration. In a preferred variant of the method of the invention, an additional layer is therefore applied below the photoresist or below the hard mask. This layer is selected such that it can be released after the conclusion of the through-etching process. In the process, the photoresist or the hard mask is then detached from the semiconductor chips as well. In other words, the material comprising the intermediate layer is selected such that it is substantially not attacked during the through-etching process and is soluble in a liquid which in turn does not dissolve the semiconductor chips or any metal contacts or metal coatings that may be present. Examples of such materials for the intermediate layer are on the one hand such dielectric materials as silicon dioxide, silicon nitride, gallium arsenide or gallium nitride, and on the other, acid-soluble metals.

The end point of the dry etching process, that is, the moment at which the wafer is completely etched through and the individual semiconductor chips are separated from one another, can be determined in various ways which are known in the prior art. Preferred methods for defining the end point are mass spectrometry and optical methods (e.g. optical emission spectroscopy). Expediently, the end point is determined by UV/VIS spectrometry in a wavelength range between 300 and 900 nm. The spectral line intensity of one of the semiconductor materials that is to be etched by the dry etching process is preferably measured. If semiconductor substrates containing gallium are used, for instance, the line intensity of the gallium can be tracked during the dry etching process. If semiconductor substrates that are composed of a plurality of elements are used, then a plurality of these elements can simultaneously be tracked by emission spectrometry. In the case of InGaN or InGaAlP, for instance, along with the spectral lines of the gallium those of the indium can also be tracked. Once the semiconductor substrate has been etched all the way through, no further semiconductor elements are released into the etching chamber, causing the line intensity of the corresponding elements to drop rapidly. If etching is done only down to the first etching trenches, which separate the p-n junctions, then the concentration of dopants in the semiconductor substrates can be utilized to control the end point.

To make it easier to electrically contact the semiconductor chips and to reduce so-called stray capacitances, via-holes can be etched into the chips simultaneously with the through-etching and severing of the semiconductor chips. These via-holes serve to connect the undersides of the semiconductor chips directly in a conventional manner.

If the separated semiconductor chips are to be further processed by conventional "pick and place" methods using typical gripper tools, then the through-etching step can be performed according to the invention in such a way that the side flanks of the semiconductor chips are curved inward relative to one or both face ends. The semiconductor chips then have a kind of constriction, which makes access to the chips and handling them easier. Preferably, the constriction is effected in such a way that the semiconductor chip has its largest basic area in the region of the surface to be bonded, while the constriction is most pronounced in the middle region of the semiconductor chip, and the surface opposite the bonding face is smaller than the bonding face. This has the advantage that the surface opposite the bonding face, that is, the surface with which the chip rests on an adhesive face, magnetic substrate or the like during the bonding, is relatively small. The force with which the chip adheres to the adhesive film or substrate is therefore not excessive, and the chip can be released relatively easily from this substrate.

Other features which are considered as characteristic for the invention are set forth in the appended claims.

Although the invention is illustrated and described herein as embodied in method for producing semiconductor chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
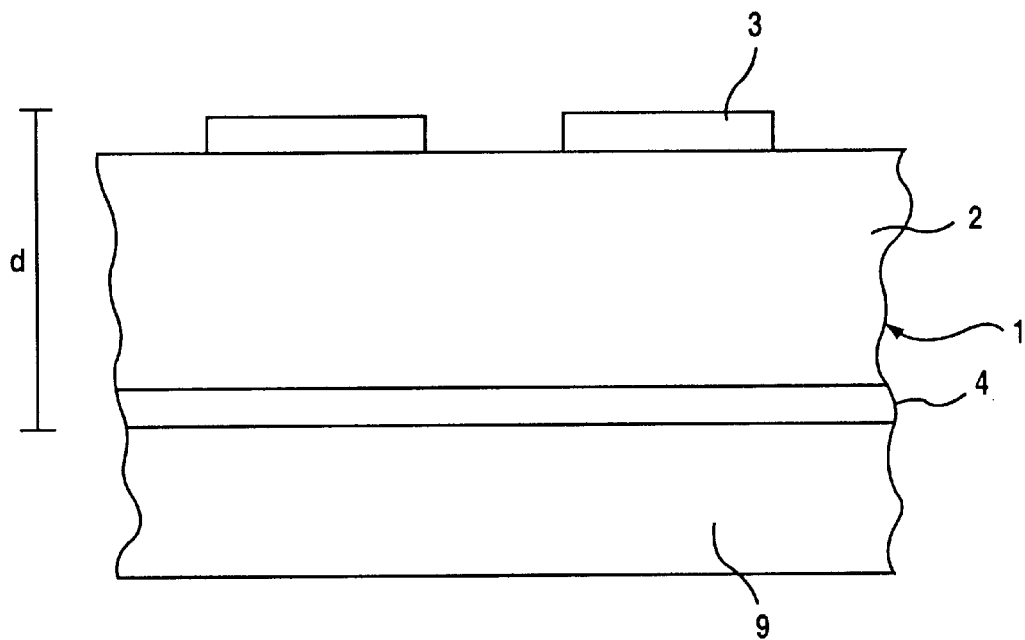
FIG. 1 is a partial schematic cross section through a configuration for performing the method of the invention at a stage prior to etching p-n junctions.
Figure 2:
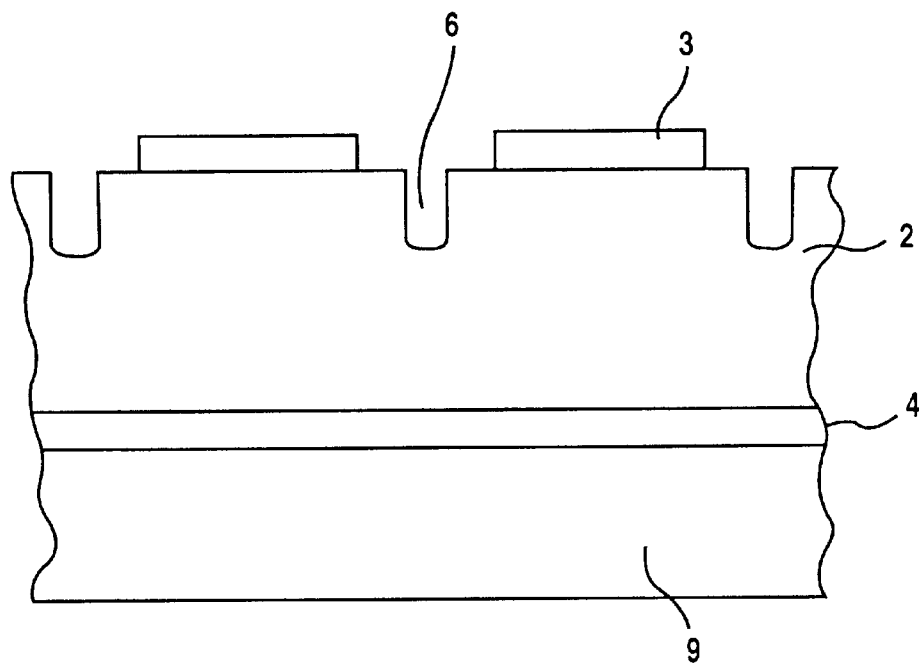
FIG. 2 is a partial schematic cross section through a configuration for performing the method of the invention at a stage after etching p-n junctions.

Referring now to the figures of the drawing in detail and first, particularly, to FIG. 1 thereof, there is seen a cross section of a wafer 1, from which LEDs are to be produced. The wafer 1 is coated over the entire surface of its back side with a metallic layer 4, for instance gold alloy. The metallic layer 4 forms an n contact. On the front side of the wafer, on a non-illustrated epitaxial layer, metal contacts 3 are provided as p contacts. As shown in FIG. 2, at the front side of the wafer, pointing toward a substrate film 9, first etching trenches 6, which separate the p-n junctions, have been etched in a first etching step. The first etching trenches 6 have a width of approximately 13 $\mu$m and a depth in the range between 13 and 20 $\mu$m, for example. If considered necessary, the semiconductor chips can be checked for operability in a conventional manner after the etching of the p-n junctions.

Figure 3:
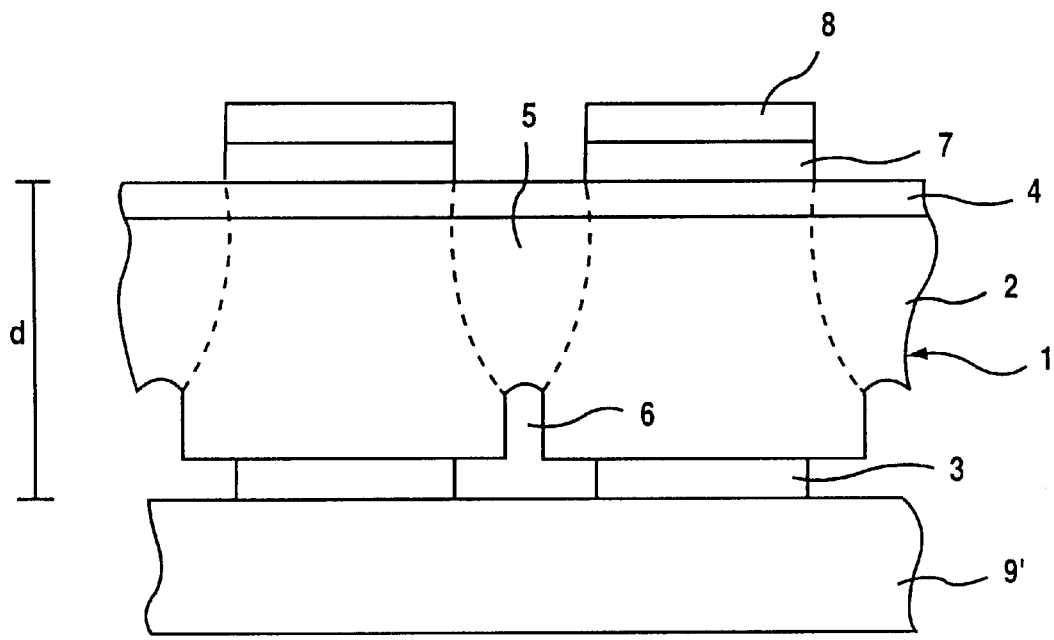
FIG. 3 is a partial schematic cross section through a configuration for performing the method of the invention, at various stages of the method.

Next, as shown in FIG. 3 with the front side downward, the wafer 1 is placed on a substrate, in order to perform the second etching step. The second etching step is etching through the wafer. An adhesive film 9' formed of plastic hereby acts as the substrate. The film 9' is expediently fastened in an annular frame, for instance of silicon. To minimize the thermal stress on the adhesive film and the wafer during the through-etching process, a metal plate of aluminum is disposed on the side of the film 9' opposite the wafer 1. The aluminum plate in turn is located on a typical carrier device of a conventional etching apparatus. These latter components are well known to those versed in this art and, for the sake of simplicity, the frame, the metal plate, and the carrier device are not illustrated.

In order to separate individual LEDs out of the wafer 1 by the dry etching process, a mask 8 is applied to the back side of the wafer. The mask 8 may be a photoresist approximately 8 $\mu$m thick, such as photoresist AZ 4562, or several layers of photoresist AZ 4533. The mask 8 leaves the wafer surface free where etching trenches, which separate the individual semiconductor chips from one another, are to be formed by the dry etching. Below the mask 8, a layer 7 is also provided, which after the conclusion of the through-etching operation is intended to make it easier to release the mask from the individual LEDs. The layer 7 may for instance be a metal layer that dissolves in an acid that does not dissolve the wafer material or the metal of the contacts 3 and the layer 4. In the case shown, the mask is embodied such that the separation zone 5 at the back side of the chip has a width of 65 $\mu$m, while the basic areas of the chips to be etched out are covered by the mask 8 over a width of 100 $\mu$m.

Figure 4:
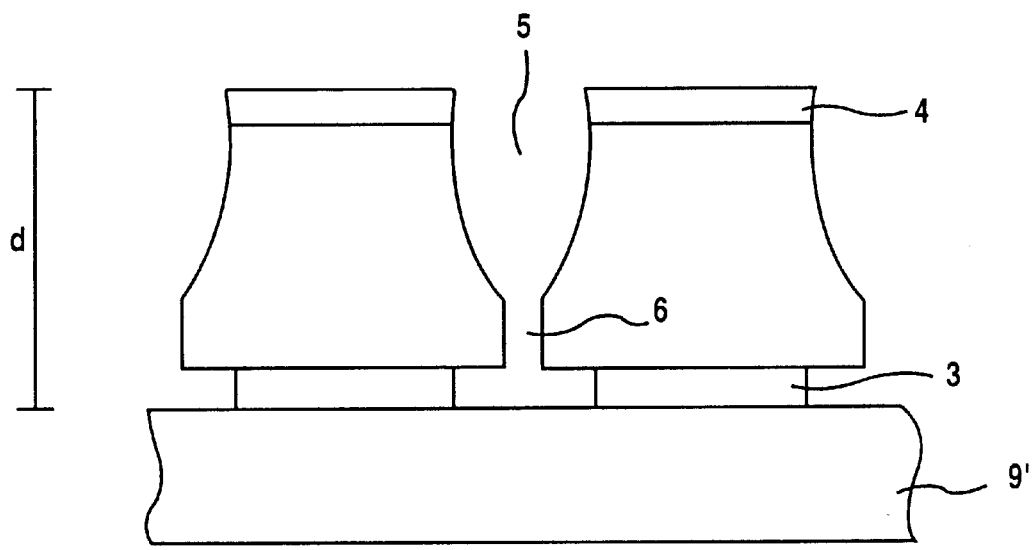
FIG. 4 is a partial schematic cross section through a configuration for performing the method of the invention at a stage after the separation zone has been etched away.

The etching operation is performed until such time as the second etching trenches 11, which are provided in the separation zone 5, reach down to the first etching trenches 6, and the wafer 1 is severed over its entire thickness d, as shown in FIG. 4. The metal layer 4 is etched in the same etching step with the same etchant as the semiconductor substrate 2.

By means of the dry etching operation, the semiconductor substrate 2 is etched out in the separation zone 5 between the individual semiconductor chips. This creates second etching trenches, which are provided in the separation zone 5, extending toward the front side of the chip and the first etching trenches 6.

Figure 5:
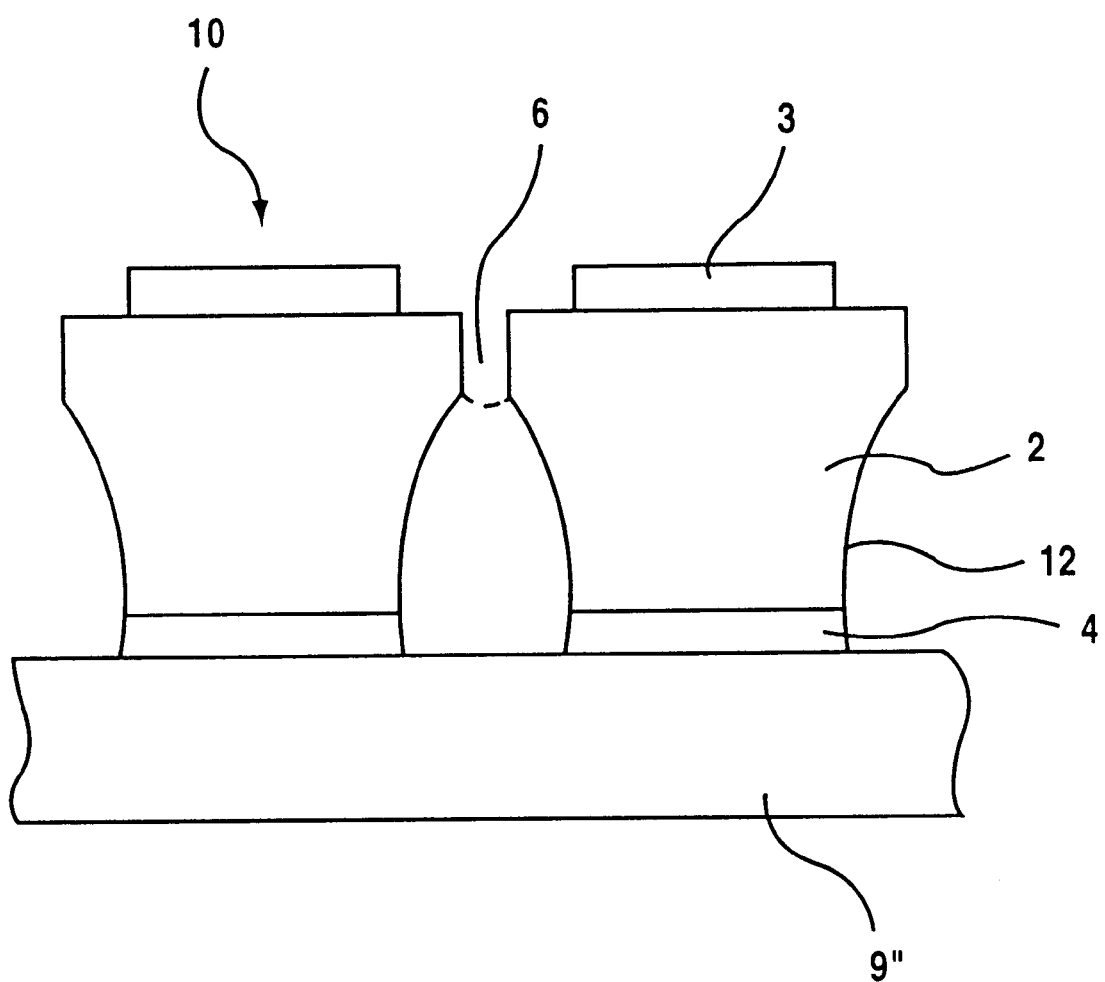
FIG. 5 is a partial schematic cross section through a configuration for performing the method of the invention at a stage after the chips have been transferred onto a new substrate film.

FIG. 5 illustrates a stage in the process sequence after the dry etching operation has been performed and after the release of the mask 8 jointly with the intermediate layer 7. By means of the complete through-etching of the wafer 1 and the metal layer 4 in the region of the separation zones 5, individual semiconductor chips have been created, in this case LEDs 10. The LEDs 10 have already been prepared for the further processing steps by being displaced from the adhesive film 9' onto a different adhesive substrate film 9".

By using dry etching to sever the wafer 1, it has been possible to preserve the chip size unchanged on the front side of the LED 10, as compared with separation using sawing. In the case shown, the width of a chip in the region of the front side is approximately 150 $\mu$m. This assures that it can be bonded and mounted.

By means of the constriction of the LEDs 10 based on the special through-etching method of the invention, i.e., the the inward curvature for the side flanks 12 compared with the chip surfaces, the LEDs can be manipulated in excellent fashion using conventional "pick and place" methods. Moreover, the surface on which the LEDs stand is relatively small, so that the LEDs do not adhere too strongly to the substrate film 9", and thus can be released relatively easily from it.

We claim:

1. A method for producing semiconductor chips from a wafer, which comprises: defining separation zones in a semiconductor material of a wafer for individual semiconductor chips on the wafer; and anisotropically dry etching trenches into the wafer at the separation zones and entirely through the wafer for severing the wafer completely into individual semiconductor chips, whereby, the severing is accomplished by steps consisting essentially of anisotropic etching and without grinding or thinning the wafer.

2. The method according to claim 1, wherein the dry etching step includes a first etching step in which p-n junctions of the semiconductor chips are separated by etching first etching trenches.

3. The method according to claim 2, which further comprises testing the semiconductor chips in the wafer after the first etching step of separating the p-n junctions.

4. The method according to claim 2, wherein the dry etching step further includes a second etching step after the first etching step, the second etching step comprising etching trenches for completely separating the semiconductor chips.

5. The method according to claim 4, wherein the first etching step comprises etching the p-n junctions on a front side of the wafer, and the second etching step comprises etching from a back-side of the wafer opposite from the p-n junctions.

6. The method according to claim 4, wherein the second etching step comprises etching side walls of the trenches forming side flanks of the semiconductor chips which are curved inwardly relative to at least one surface of the respective semiconductor chip.

7. The method according to claim 1, wherein the dry etching step comprises an etching process selected from the group consisting of reactive ion etching (RIE), electron cyclotron resonance etching (ECR), and etching with an inductively coupled plasma source (ICP).

8. The method according to claim 1, wherein the etching step comprises etching with a mixture of a Lewis acid and chlorine as the etchant.

9. The method according to claim 8, wherein the etchant is the Lewis acid with chlorine in a molar ratio of from 1:9 to 9:1.

10. The method according to claim 9, wherein the molar ratio is substantially 1:1.

11. The method according to claim 8, wherein the Lewis acid is selected from the group consisting of boron trichloride, boron tribromide, and boron trifluoride.

12. The method according to claim 8, wherein the Lewis acid is boron trichloride and the mixture with chlorine is in a molar ratio of substantially 1:1.

13. The method according to claim 4, wherein the second etching step is performed at a temperature above 150° C. for a time period of from 15 minutes to three hours.

14. The method according to claim 13, wherein the second etching step is performed at a temperature above 200° C.

15. The method according to claim 1, which further comprises placing the wafer on a plastic film that is resistant and chemically inert under conditions of the dry etching process.

16. The method according to claim 15, wherein the plastic film is an adhesive film.

17. The method according to claim 15, which further comprises fastening the film to a frame.

18. The method according to claim 15, which further comprises fastening the film to an annular frame of silicon.

19. The method according to claim 15, which further comprises placing a plate of metal on the film opposite from the wafer.

20. The method according to claim 19, wherein the plate of metal is an aluminum plate.

21. The method according to claim 1, which further comprises placing the wafer on a magnetic substrate.

22. The method according to claim 1, which further comprises placing the wafer on a ferromagnetic substrate.

23. The method according to claim 1, wherein the wafer has metal contacts or a full-surface metal coating on at least one of its surfaces, and the dry etching step comprises fully etching through the metal contacts or metal coating in the separation zone between the semiconductor chips.

24. The method according to claim 23, wherein the metal contacts or metal coating are formed of gold or a gold alloy.

25. The method according to claim 4, which further comprises coating the surface of the wafer exposed to the etchant, before a beginning of the second etching step, with a hard mask or a mask of photoresist, leaving the separation zone between the semiconductor chips free.

26. The method according to claim 25, which further comprises applying a layer of a material that is substantially not attacked during the dry etching process and that is soluble in a liquid that does not dissolve the semiconductor chips, the metal contacts, and the metal coating, under the photoresist or under the hard mask.

27. The method according to claim 26, wherein the layer is formed of dielectric material.

28. The method according to claim 27, wherein the dielectric material is selected from the group consisting of silicon dioxide, silicon nitride, gallium arsenide, and gallium nitride.

29. The method according to claim 26, wherein the layer is formed of an acid-soluble metal.

30. The method according to claim 1, which further comprises determining an end point of the dry etching process by one of mass spectrometry, and an optical process.

31. The method according to claim 1, which further comprises determining an end point of the dry etching process by UV/VIS spectrometry.

32. The method according to claim 1, which further comprises determining an end point of the dry etching process by determining a spectral line intensity of at least one of the semiconductor materials to be etched.

33. The method according to claim 26, which further comprises, subsequently to a termination of the dry etching process, jointly removing the hard mask or photoresist and the layer located under the hard mask or photoresist, by releasing the layer from the semiconductor chips.

34. The method according to claim 4, which further comprises, simultaneously with the etching of the second etching trenches, etching via holes for into the wafer.

35. The method according to claim 1, wherein the dry etching step comprises severing the wafer into semiconductor chips having an edge length of at least 100 $\mu$m.

36. The method according to claim 35, wherein the dry etching step comprises severing the wafer into individual LEDs.

37. The method according to claim 30, wherein the optical process is an optical emission spectroscopy.

* * * * *